United States Patent
Yang et al.

(10) Patent No.: US 8,445,911 B2
(45) Date of Patent: May 21, 2013

(54) ACTIVE DEVICE ARRAY SUBSTRATE

(75) Inventors: Ching-Jung Yang, Taoyuan County (TW); Ke-Chih Chang, Taipei (TW); Kuo-Yu Huang, Hsinchu County (TW); Yu-Cheng Chen, Hsinchu (TW)

(73) Assignee: Au Optronics Corporation, Hsinchu (TW)

( * ) Notice: Subject to any disclaimer, the term of this patent is extended or adjusted under 35 U.S.C. 154(b) by 464 days.

(21) Appl. No.: 12/770,737

(22) Filed: Apr. 30, 2010

(65) Prior Publication Data

US 2011/0156038 A1    Jun. 30, 2011

(30) Foreign Application Priority Data

Dec. 31, 2009   (TW) ............................... 98146389 A

(51) Int. Cl.
*H01L 29/04* (2006.01)
*H01L 29/10* (2006.01)
*H01L 31/00* (2006.01)

(52) U.S. Cl.
USPC .................. 257/59; 257/68; 257/69; 257/72; 257/291; 257/347; 257/E33.053; 438/30; 349/39; 349/41; 349/42; 349/43; 349/113; 349/114; 349/138; 349/139; 349/143

(58) Field of Classification Search
USPC .......... 257/59, 68, 69, 72, 291, 347, E33.053; 438/30; 349/39, 41–43, 113, 114, 138, 139, 349/143

See application file for complete search history.

(56) References Cited

FOREIGN PATENT DOCUMENTS

| JP | 2003-149681 | 5/2003 |
|---|---|---|
| TW | I222047 | 10/2004 |
| TW | I262344 | 9/2006 |
| TW | 200925752 | 6/2009 |
| TW | 200935491 | 8/2009 |
| TW | 201009434 | 3/2010 |

*Primary Examiner* — Meiya Li
(74) *Attorney, Agent, or Firm* — Jianq Chyun IP Office

(57) ABSTRACT

An active device array substrate including a substrate, scan lines, data lines, active devices, a first dielectric layer, a common line, a second dielectric layer, a patterned conductive layer, a third dielectric layer, and pixel electrodes is provided. At least a part of the active devices are electrically connected to the scan lines and the data lines. The first dielectric layer covers the scan lines, the data lines and the active devices. The common line is disposed on the first dielectric layer. The second dielectric layer covers the common line and the first dielectric layer. The patterned conductive layer is disposed on the second dielectric layer. The third dielectric layer covers the patterned conductive layer and the second dielectric layer. The pixel electrodes are disposed on the third dielectric layer and electrically connected to the patterned conductive layer and the active devices.

13 Claims, 13 Drawing Sheets

ACTIVE DEVICE ARRAY SUBSTRATE

CROSS-REFERENCE TO RELATED APPLICATION

This application claims the priority benefit of Taiwan application serial no. 98146389, filed on Dec. 31, 2009. The entirety the above-mentioned patent application is hereby incorporated by reference herein and made a part of specification.

BACKGROUND OF THE INVENTION

1. Field of the Invention

The present application generally relates to an array substrate, and more particularly, to an active device array substrate.

2. Description of Related Art

In general speaking, a liquid crystal display panel (LCD panel) mainly comprises an active device array substrate, an opposite substrate and a liquid crystal layer disposed between the active device array substrate and the opposite substrate, wherein the active device array substrate includes a display region and a non-display region. In the display region, a plurality of pixel units are disposed and arranged in an array, and each pixel unit includes a thin film transistor (TFT) and a pixel electrode connected to the TFT. In addition, a plurality of scan lines and a plurality of data lines are disposed in the display region. The TFT of each pixel unit is electrically connected to one of the scan lines and one of the data lines correspondingly. In the non-display region, signal lines, source drivers and gate drivers are disposed.

When an image is displayed on the LCD panel, the gate drivers would sequentially turn on each row of pixels within the display panel, and during the time that each row of pixels are turned on, data voltages provided by the source drivers are applied to the corresponding pixels. In this way, the liquid crystal molecules in each row of pixels would be properly driven according to the data voltage.

Along with the increasing resolution of an LCD panel however, the number of the gate drivers and the source drivers of an LCD must be increased to promote the resolution. As a result, the production cost of an LCD is accordingly increased with the increasing number of the gate drivers and the source drivers. If the number of the gate drivers and the source drivers can be reduced, the manufacturing cost can be reduced.

SUMMARY OF THE INVENTION

Accordingly, the present application is directed to an active device array substrate, which is able to prevent the reflective layer thereof from being peeled off.

The present application provides an active device array substrate, which includes a substrate, a plurality of scan lines, a plurality of data lines, a plurality of active devices, a first dielectric layer, a common line, a second dielectric layer, a patterned conductive layer, a third dielectric layer and a plurality of pixel electrodes. The scan lines are disposed on the substrate, the data lines are disposed on the substrate and the active devices are disposed on the substrate, wherein at least a part of the active devices are electrically connected to the scan lines and the data lines. The first dielectric layer covers the scan lines, the data lines and the active devices. The common line is disposed on the first dielectric layer. The second dielectric layer covers the common line and the first dielectric layer. The patterned conductive layer is disposed on the second dielectric layer. The third dielectric layer covers the patterned conductive layer and the second dielectric layer. The pixel electrodes are disposed on the third dielectric layer and electrically connected to the patterned conductive layer and the active devices, and the patterned conductive layer and the common line are coupled to each other to form a storage capacitor.

In an embodiment of the present application, each of the above-mentioned active devices includes a thin film transistor (TFT).

In an embodiment of the present application, the above-mentioned first dielectric layer has a plurality of first contact holes, the second dielectric layer has a plurality of second contact holes located over the first contact holes, and the patterned conductive layer is electrically connected to the active devices via the first contact holes and the second contact holes.

In an embodiment of the present application, the above-mentioned third dielectric layer has a plurality of third contact holes located over the second contact holes and the pixel electrodes are electrically connected to the patterned conductive layer via the third contact holes.

In an embodiment of the present application, the above-mentioned active device array substrate further has a plurality of reflective layers, wherein the third dielectric layer has a plurality of bumps located on a top-surface, the reflective layers are disposed on the top-surface of the third dielectric layer and the pixel electrodes cover the reflective layers.

In an embodiment of the present application, the material of the above-mentioned patterned conductive layer includes transparent conductive material.

In an embodiment of the present application, the material of the above-mentioned patterned conductive layer and the material of the pixel electrodes are substantially the same as each other.

In an embodiment of the present application, the above-mentioned scan lines and data lines are intersected with each other to define a plurality of display regions, wherein the active devices and the pixel electrodes together form a plurality of display units within the display regions. Each of the display units is respectively electrically connected to two of the scan lines and one of the data lines, the pixel electrodes include a first pixel electrode and a second pixel electrode, and the active devices include a first active device and a second active device. The first active device and the first pixel electrode electrically connected to the first active device together form a first sub-pixel. The first active device is electrically connected to the second active device. The second active device and the second pixel electrode together form a second sub-pixel. The first active device and the second active device are respectively electrically connected to different scan lines, and the second active device is electrically connected to a corresponding data line through the first active device. Among a same row of the display units, two adjacent display units are respectively electrically connected to different data lines.

In an embodiment of the present application, the above-mentioned active device array substrate further includes a plurality of scan-signal transmission lines, and each of the scan-signal transmission line is respectively electrically connected to one of the scan lines.

In an embodiment of the present application, the quantity of above-mentioned scan-signal transmission lines is less than or equal to the quantity of the scan lines.

In an embodiment of the present application, each of the above-mentioned scan-signal transmission lines is respectively located between two adjacent data lines.

In an embodiment of the present application, the extending direction of the above-mentioned scan-signal transmission lines and the extending direction of the data lines are substantially parallel to each other.

In an embodiment of the present application, each of the above-mentioned scan-signal transmission lines includes a first conductive pattern and a second conductive pattern, wherein the second conductive pattern is electrically connected to the first conductive pattern and the second conductive patterns and the scan lines are intersected with each other.

Based on the depiction above, the active device array substrate of the present application is designed in this way that the pixel electrodes cover the reflective layers made of metal, so that the reflective layers can be avoided from being peeled off due to oxidation, which is helpful to advance the yield rate of the production. On the other hand, since the active device array substrate of the present application has a common line which is able to be coupled with the patterned conductive layer to form storage capacitors and thereby the capacitance of the storage capacitors can be increased.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
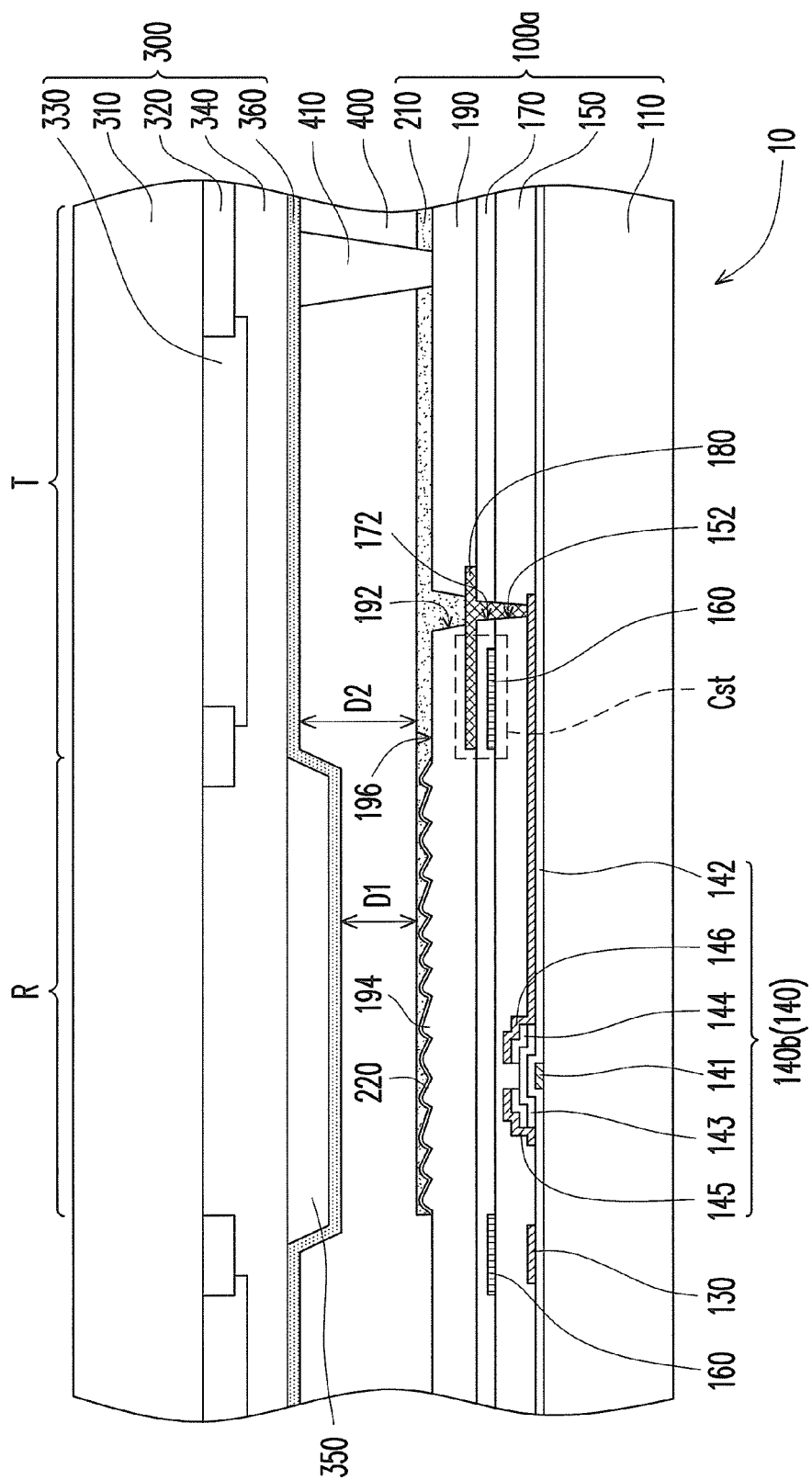
FIG. 1 is a sectional diagram of a display panel according to an embodiment of the present application.

Reference will now be made in detail to the present preferred embodiments of the invention, examples of which are illustrated in the accompanying drawings. Wherever possible, the same reference numbers are used in the drawings and the description to refer to the same or like parts.

FIG. 1 is a sectional diagram of a display panel according to an embodiment of the present application and FIGS. 2A-2J are top views of the disassembled parts of the active device array substrate of FIG. 1. In FIG. 1, the cross-section of the active device array substrate 100a is made along line I-I' in FIGS. 2A-2J, and for simplicity, partial films in FIG. 1 are also omitted in FIGS. 2A-2J.

Referring to FIG. 1, a display panel 10 of the embodiment includes an active device array substrate 100a, an opposite substrate 300 and a display medium layer 400, wherein the opposite substrate 300 is located over the active device array substrate 100a, and the display medium layer 400 is located between the active device array substrate 100a and the opposite substrate 300. The display medium layer 400 herein is, for example, a liquid crystal layer.

In more details, the active device array substrate 100a includes a substrate 110, a plurality of scan lines 120 (referring to FIG. 2A), a plurality of data lines 130 (referring to FIG. 2D), a plurality of active devices 140 (referring to FIG. 2D), a first dielectric layer 150, a common line 160, a second dielectric layer 170, a patterned conductive layer 180, a third dielectric layer 190 and a plurality of pixel electrodes 210.

The scan lines 120, data lines 130 and active devices 140 are disposed on the substrate 110. The active devices 140 include a first active device 140a and a second active device 140b, and at least a part of the active devices 140 (i.e., the first active device 140a) is electrically connected to the scan lines 120 and the data lines 130. The first active device 140a is electrically connected to the pixel electrode 212 (referring to FIG. 2J), while the pixel electrode 212 is electrically connected to the second active device 140b. In other words, in the active device array substrate 100a of the embodiment, not all the active devices 140 are electrically connected to the data lines 130. In other alternative embodiments however, each of the active devices 140 can be electrically connected to a corresponding data line 130.

The first dielectric layer 150 covers the scan lines 120, the data lines 130 and the active devices 140. The common line 160 (referring to FIG. 2E) is disposed on the first dielectric layer 150, wherein the common line 160 is, for example, a common-ring, and the common line 160 and the scan lines 120 and the data lines 130 can belong to/be formed by different films. The second dielectric layer 170 covers the common line 160 and the first dielectric layer 150. The patterned conductive layer 180 (referring to FIG. 2G) is disposed on the second dielectric layer 170. The third dielectric layer 190 covers the patterned conductive layer 180 and the second dielectric layer 170. The pixel electrodes 210 (referring to FIG. 2J) are disposed on the third dielectric layer 190 and substantially or entirely cover the reflective region R, which means the pixel electrodes 210 are entirely or substantially located on the reflective layer, wherein the pixel electrodes 210 are electrically connected to the patterned conductive layer 180 and the active devices 140. The patterned conductive layer 180 is coupled with the common line 160 to form a storage capacitor Cst, which is helpful to increase the capacitance of the storage capacitor.

In the embodiment, the scan lines 120 and the data lines 130 are intersected with each other to define a plurality of display regions C1 (referring to FIGS. 2D and 2J), while the active devices 140 and the pixel electrodes 210 together form display units C2 disposed within the display region C1. Each of the display units C2 is respectively electrically connected to two of the scan lines 120 and one of the data lines 130. In more details, the pixel electrode 210 in each display unit C2 of the embodiment includes a first pixel electrode 212 and a second pixel electrode 214, wherein the first active device 140a and the first pixel electrode 212 electrically connected to the first active device 140a together form a first sub-pixel P1, and the second active device 140b and the second pixel electrode 214 together form a second sub-pixel P2. In particular, the first active device 140a of the embodiment is electrically connected to the second active device 140b through the patterned conductive layer 180, referring to FIG. 2G. The first active device 140a and the second active device 140b are respectively electrically connected to different scan lines 120, while the second active device 140b is electrically connected to the corresponding data line 130 through the first active device 140a. In addition, among a same row of the display units C2, two adjacent display units C2 are respectively electrically connected to different data lines 130.

Briefly, the design of the active device array substrate 100a of the embodiment features that the two adjacent first sub-pixel P1 and second sub-pixel P2 are electrically connected to a same data line 130, so that the required number of the data lines 130 is less than the number of the data lines 130 required by the prior art by a half, which can further reduce the usage quantity of the source drivers (not shown). The above-mentioned layout of the pixel structure is so-called half source driving architecture (HSD architecture).

Figure 2A:
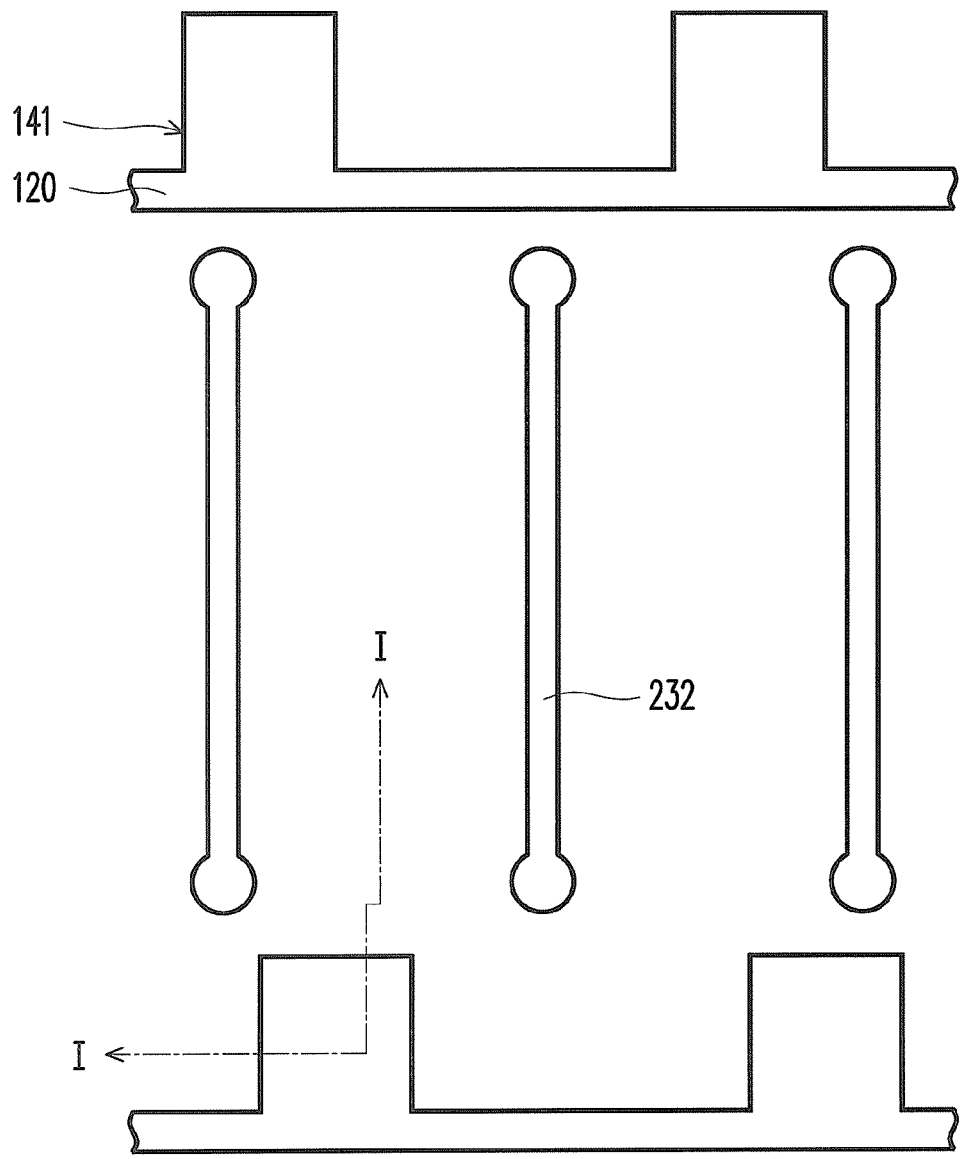
FIGS. 2A-2J are top views of the disassembled parts of the active device array substrate of FIG. 1.
Figure 2B:
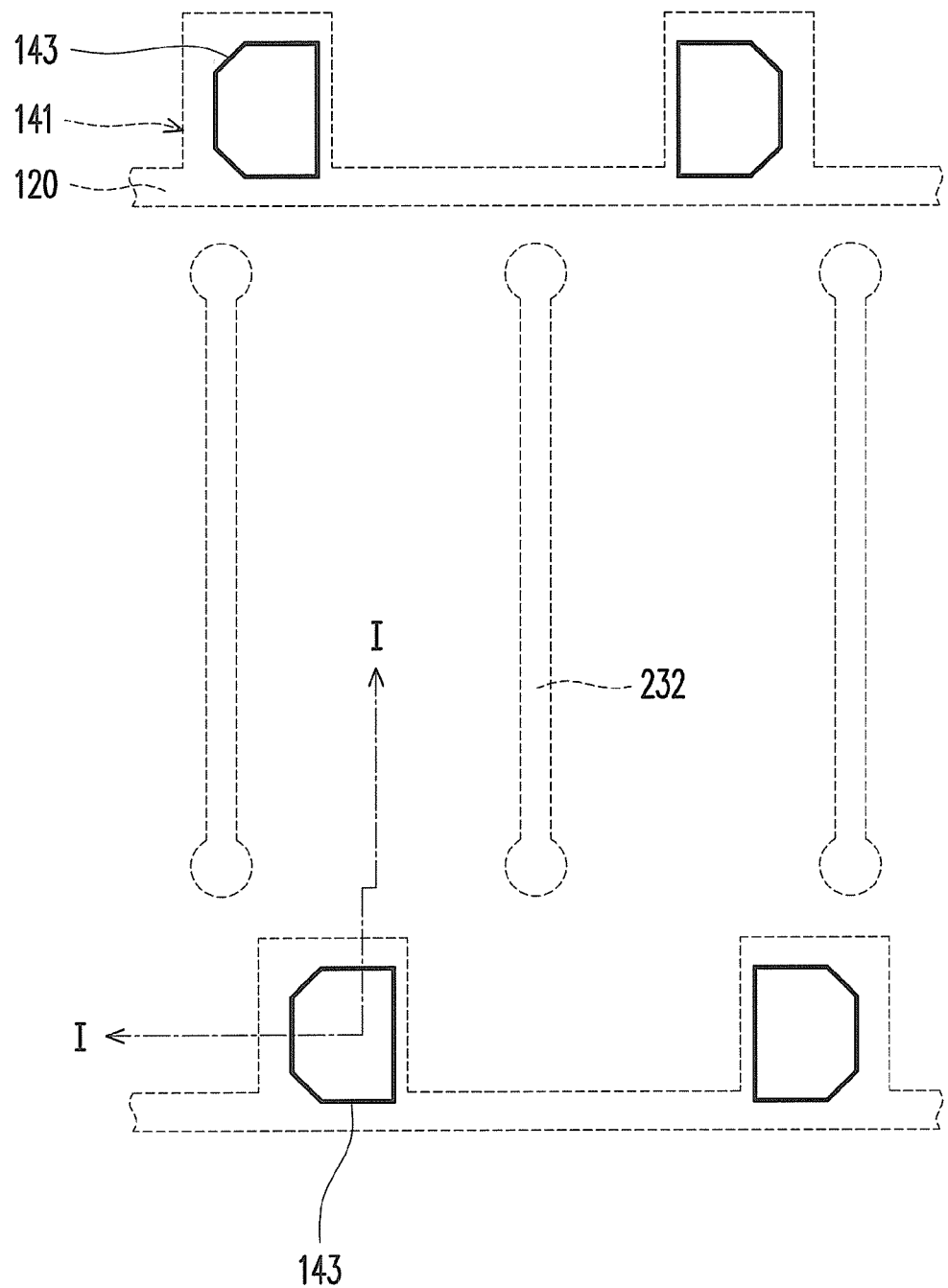
Figure 2C:
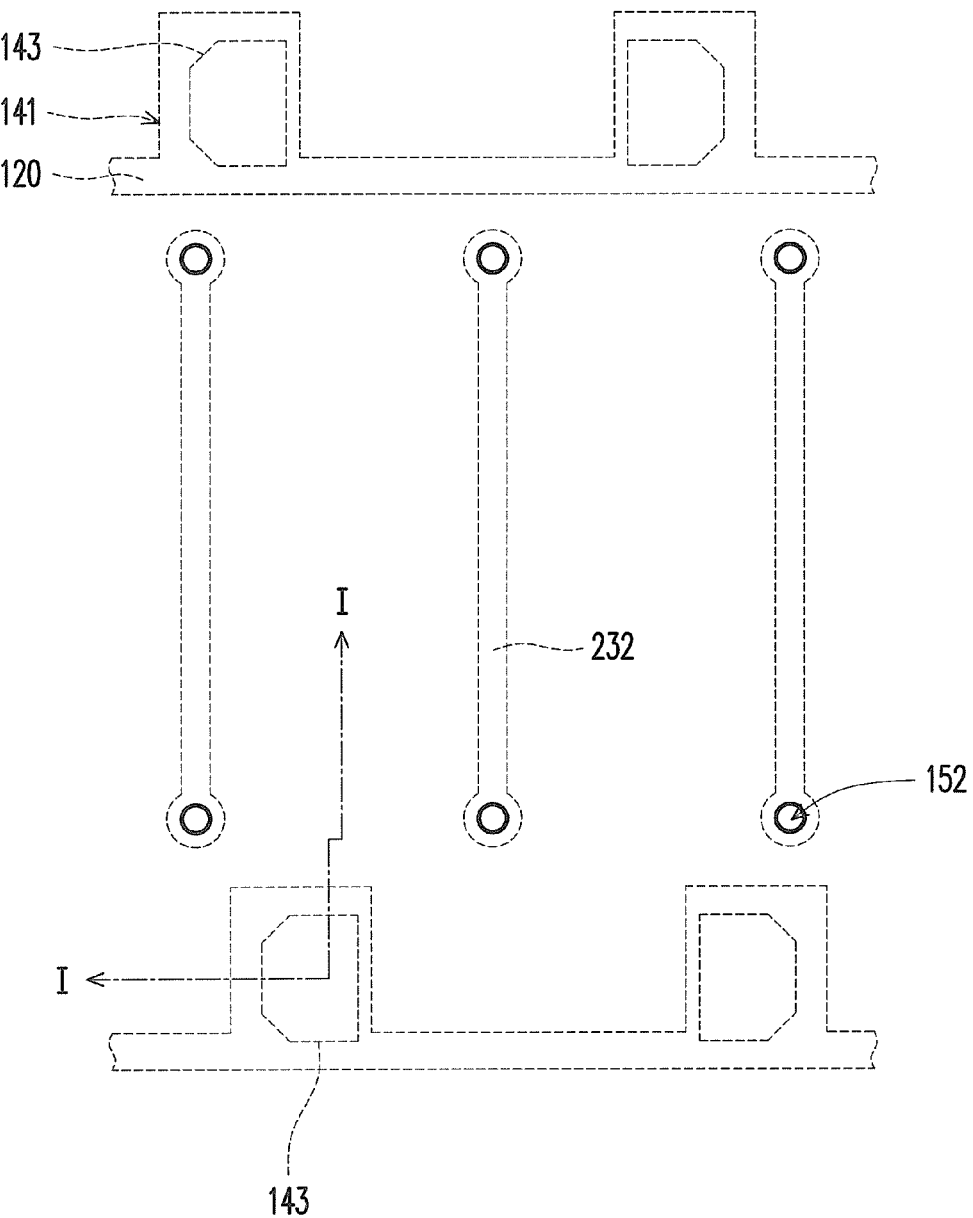
Figure 2D:
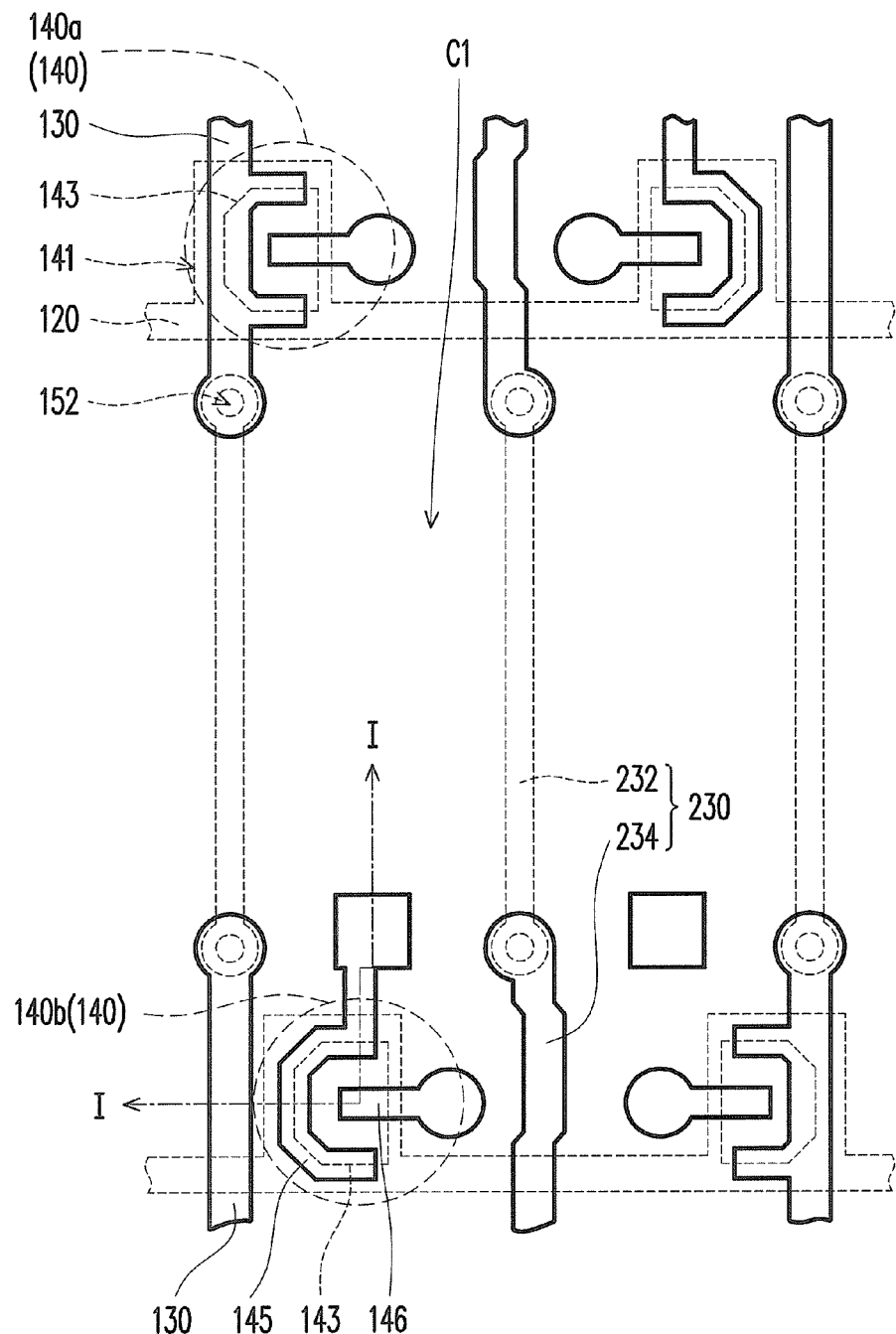
Figure 2E:
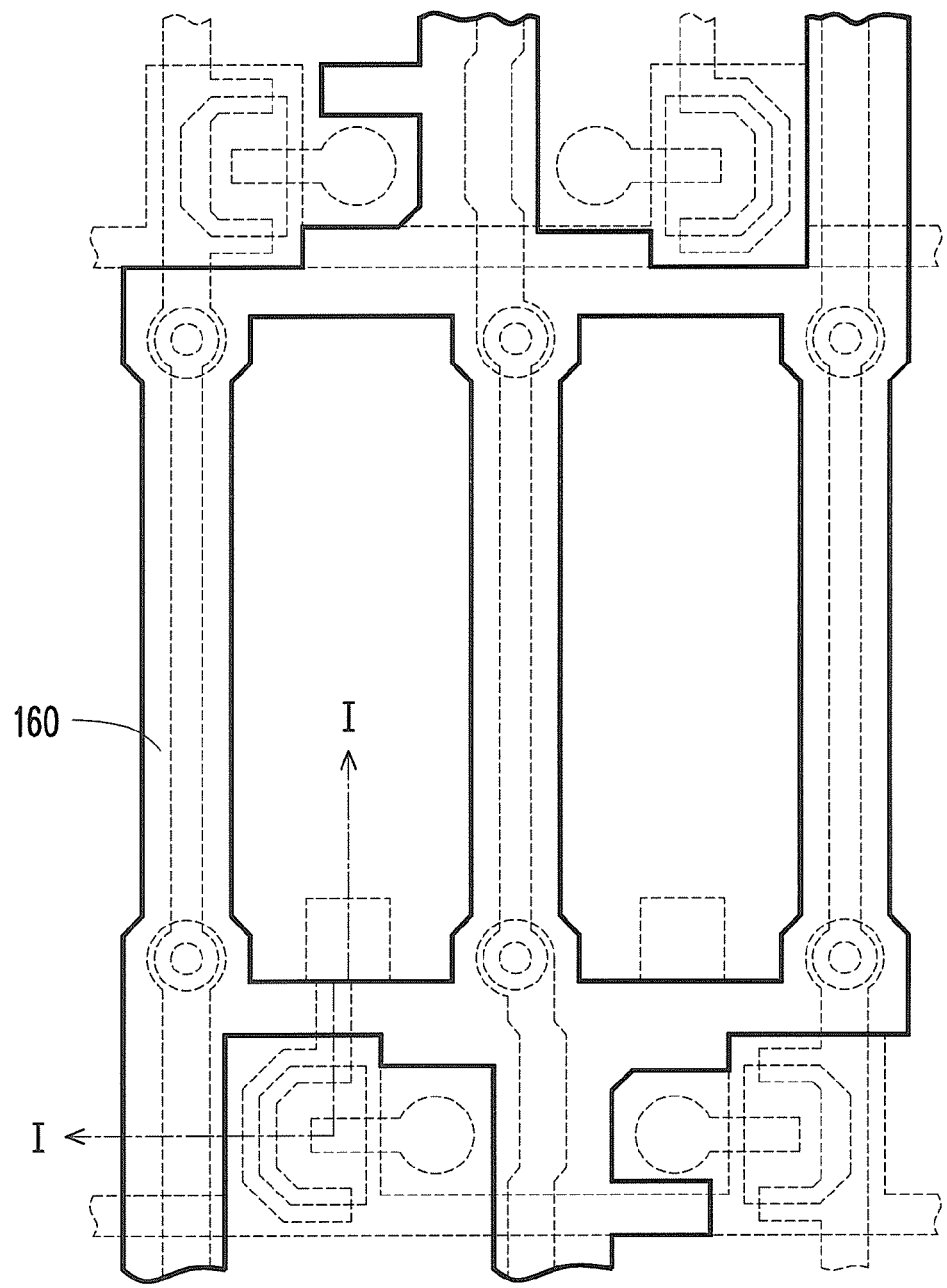
Figure 2F:
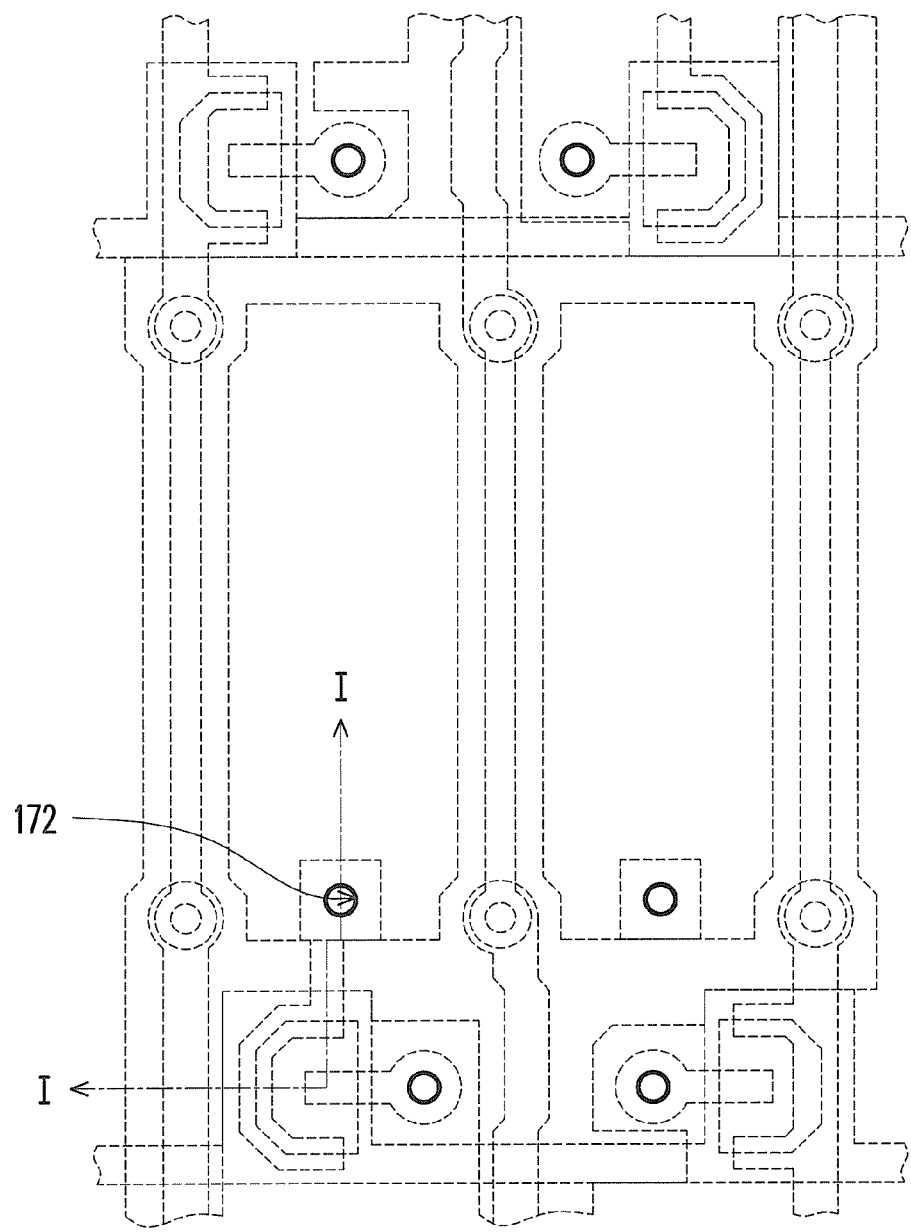
Figure 2G:
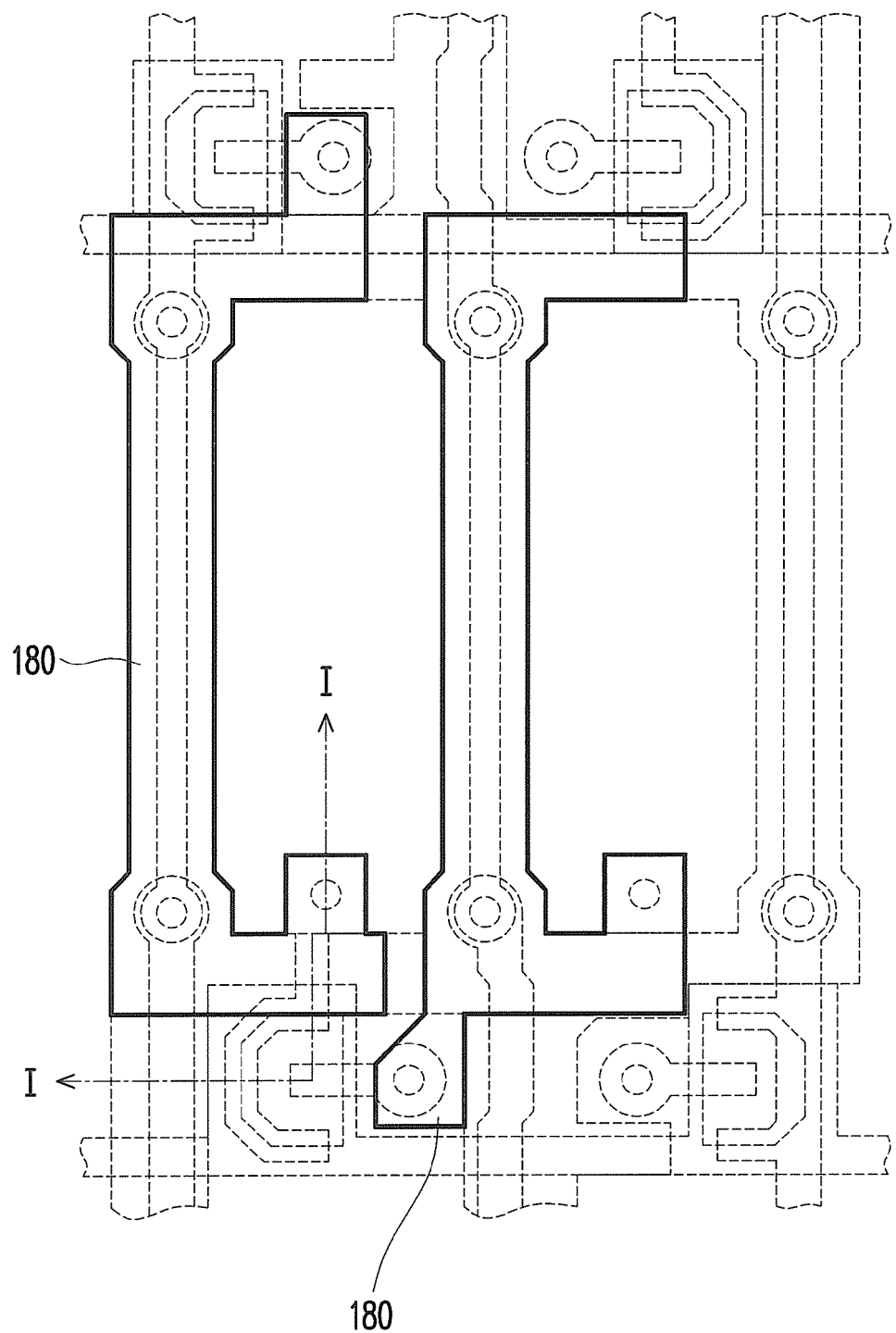
Figure 2H:
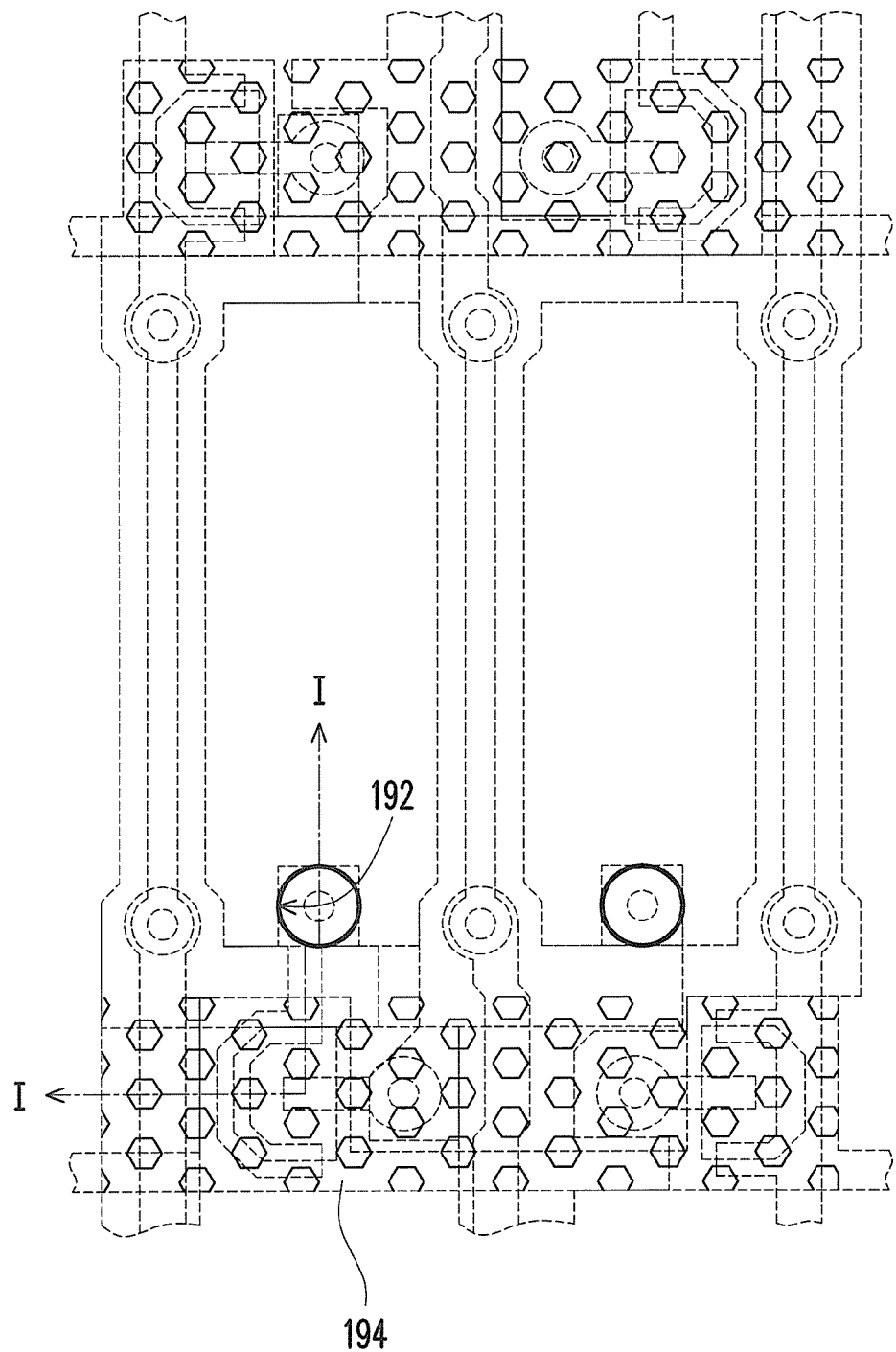

Referring to FIG. 1, the active device 140 (including the first active device 140a and the second active device 140b) is a TFT comprising, for example, a gate 141 (referring to FIG. 2A), a gate dielectric layer 142, a channel layer 143 (referring to FIG. 2B), an ohmic contact layer 144, a source 145 (referring to FIG. 2D) and a drain 146 (referring to FIG. 2D). The material of the patterned conductive layer 180 is, for example, transparent conductive material such as indium tin oxide (ITO) or indium zinc oxide (IZO). In particular, the materials of the patterned conductive layer 180 and the pixel electrodes 210 are substantially the same, i.e., the material of the pixel electrodes 210 can be transparent conductive material as well.

Referring to FIGS. 1, 2C, 2F and 2H, the first dielectric layer 150 in the embodiment has a plurality of first contact holes 152, and the second dielectric layer 170 has a plurality of second contact holes 172 located over the first contact holes 152, wherein the patterned conductive layer 180 is electrically connected to the drain 136 of the active devices 140 (i.e., the second active device 140b) through the first contact hole 152 and the second contact hole 172. Besides, the third dielectric layer 190 of the embodiment has a plurality of third contact holes 192 located over the second contact holes 172, and the pixel electrodes 210 are electrically connected to the patterned conductive layer 180 through the third contact holes 192.

It should be noted that the present application does not limit the manner of electrical connections between the patterned conductive layer 180 and the drain 146 of the active devices 140 and between the pixel electrodes 210 and the patterned conductive layer 180.

Figure 3:
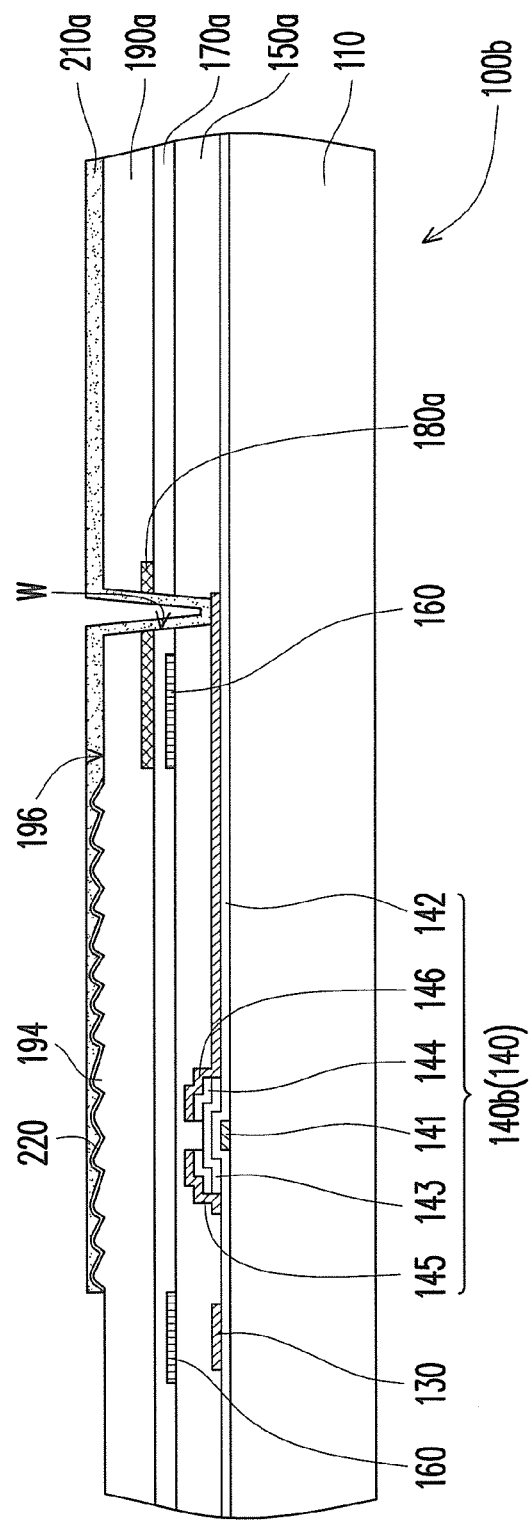
FIG. 3 is a sectional diagram of an active device array substrate according to another embodiment of the present application.

FIG. 3 is a sectional diagram of an active device array substrate according to another embodiment of the present application. Referring to FIG. 3, in the active device array substrate 100b of the embodiment, the third dielectric layer 190a has at least a contact hole W passing through the patterned conductive layer 180a, the second dielectric layer 170a and the first dielectric layer 150a, wherein the contact hole W exposes the drain 146 of the active device 140, and the pixel electrode 210a covers the top-surface 196 of the third dielectric layer 190a and is directly electrically connected to the drain 146 of the active device 140 through the contact hole W. At this time, the pixel electrode 210a is also electrically connected to the patterned conductive layer 180a through the contact hole W.

Figure 2I:
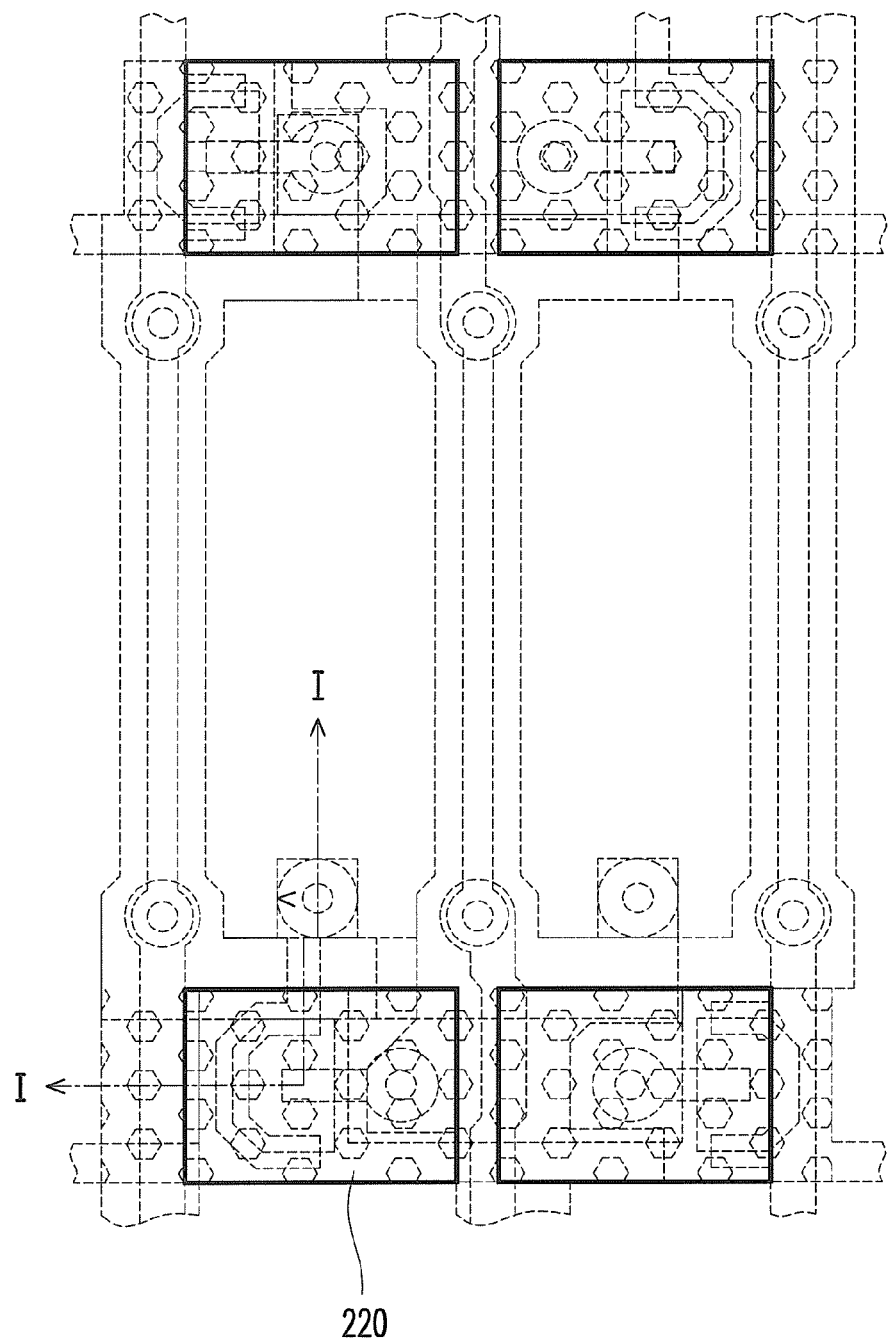
Figure 2J:
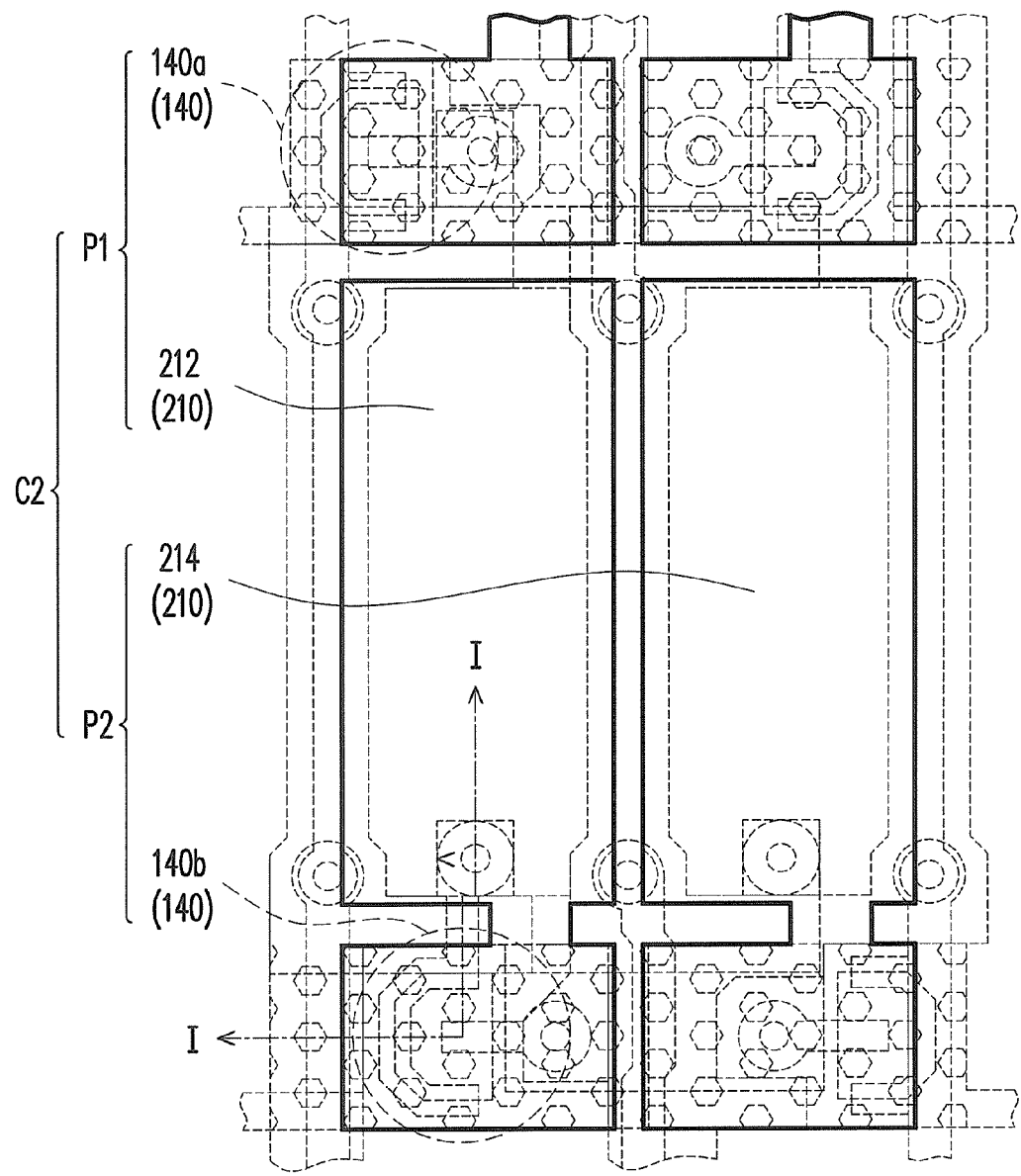

Referring to FIGS. 1, 2I and 2J, the active device array substrate 100a in the embodiment further includes a plurality of reflective layers 220, wherein the third dielectric layer 190 has a plurality of bumps 194 located on a top-surface 196, and the reflective layers 220 are disposed at the top-surface 196 of the third dielectric layer 190 so as to cover the bumps 194. The pixel electrodes 210 cover the reflective layers 220. In the embodiment, the location where the reflective layers 220 are disposed can be defined as a reflective region R, while the location without disposing the reflective layers 220 can be defined as a transmissive region T. In other words, each sub-pixel (for example, a first sub-pixel P1) has both a transmissive region T and a reflective region R. The bumps 194 are, for example, micro-structures formed on surface of the third dielectric layer 190. The material of the reflective layers 220 includes metal, for example, aluminium or silver. In general speaking, the reflective layers 220 made of metal are likely peeled off due to oxidation. In the embodiment however, since a layer of pixel electrodes 210 covers the reflective layers 220; in particular, the pixel electrodes 210 entirely cover the reflective layers 220 so that the reflective layers 220 can be effectively avoided from being peeled off, which further effectively promote the yield rate of the active device array substrate 100a.

Referring to FIGS. 1, 2A and 2D, in the embodiment, the active device array substrate 100a further includes a plurality of scan-signal transmission lines 230, wherein each of the scan-signal transmission lines 230 is respectively electrically connected to one of the scan lines 120. In more details, each of the scan-signal transmission lines 230 of the embodiment is respectively located between two adjacent data lines 130, and the extending direction of the scan-signal transmission lines 230 and the extending direction of the data lines 130 are substantially parallel to each other. In other words, the design of the scan-signal transmission lines 230 in the embodiment can effectively reduce the quantity of the fan-out traces at the ends of the scan lines 120. The above-mentioned design of the scan-signal transmission lines 230 is so-called tracking gate-line in pixel (TGP) design.

Moreover, each of the scan-signal transmission lines 230 in the embodiment includes a first conductive pattern 232 and a second conductive pattern 234, wherein the first conductive pattern 232 is formed simultaneously when forming the scan lines 120 and the second conductive pattern 234 is formed simultaneously when forming the data lines 130. The second conductive pattern 234 is electrically connected to the first conductive pattern 232, wherein the second conductive pattern 234 is intersected with the scan lines 120, i.e., the second conductive pattern 234 is across over (or intersected with) the scan lines 120. Each of the scan-signal transmission lines 230 in the embodiment is respectively electrically connected to one of the scan lines 120 and insulated from the rest scan lines 120. It should be noted that the quantity of the scan-signal transmission lines 230 can be less than or equal to the quantity of the scan lines 120, which the present application is not limited to.

As shown by FIG. 1, the opposite substrate 300 of the embodiment includes a substrate 310, a black matrix layer 320, a color filter layer 330, a passivation layer 340, an auxiliary layer 350 and a common electrode layer 360. The substrate 310 herein is, for example, a glass substrate. The black matrix layer 320, the color filter layer 330 and the passivation layer 340 are disposed on the substrate 310. The black matrix layer 320 locally covers the color filter layer 330. The passivation layer 340 covers the black matrix layer 320 and the color filter layer 330. The auxiliary layer 350 is disposed on the passivation layer 340 and occupies a position corresponding to/vertically over the reflective layer 220 on the active device array substrate 100a, which means the auxiliary layer 350 does not entirely cover the passivation layer 340, and the auxiliary layer 350 is disposed only at the position where it is corresponding to the reflective layer 220, i.e., the auxiliary layer 350 is disposed only at the reflective region R. As a result, dual cell gaps are formed between the opposite substrate 300 and the active device array substrate 100a.

At the position where the auxiliary layer 350 is disposed, i.e. at the reflective region R, the cell gap between the opposite substrate 300 and the active device array substrate 100a is D1, while at the position where no auxiliary layer 350 is disposed, i.e., at the transmissive region T, the cell gap between the opposite substrate 300 and the active device array substrate 100a is D2. The cell gap D1 is, for example, a half of the cell gap D2. The technique where the auxiliary layer 350 is disposed on the opposite substrate 300 having the color filter layer 330 and dual cell gaps are formed between the opposite substrate 300 and the active device array substrate 100a is usually termed as multi-gap on color filter layer technique.

Figure 4:
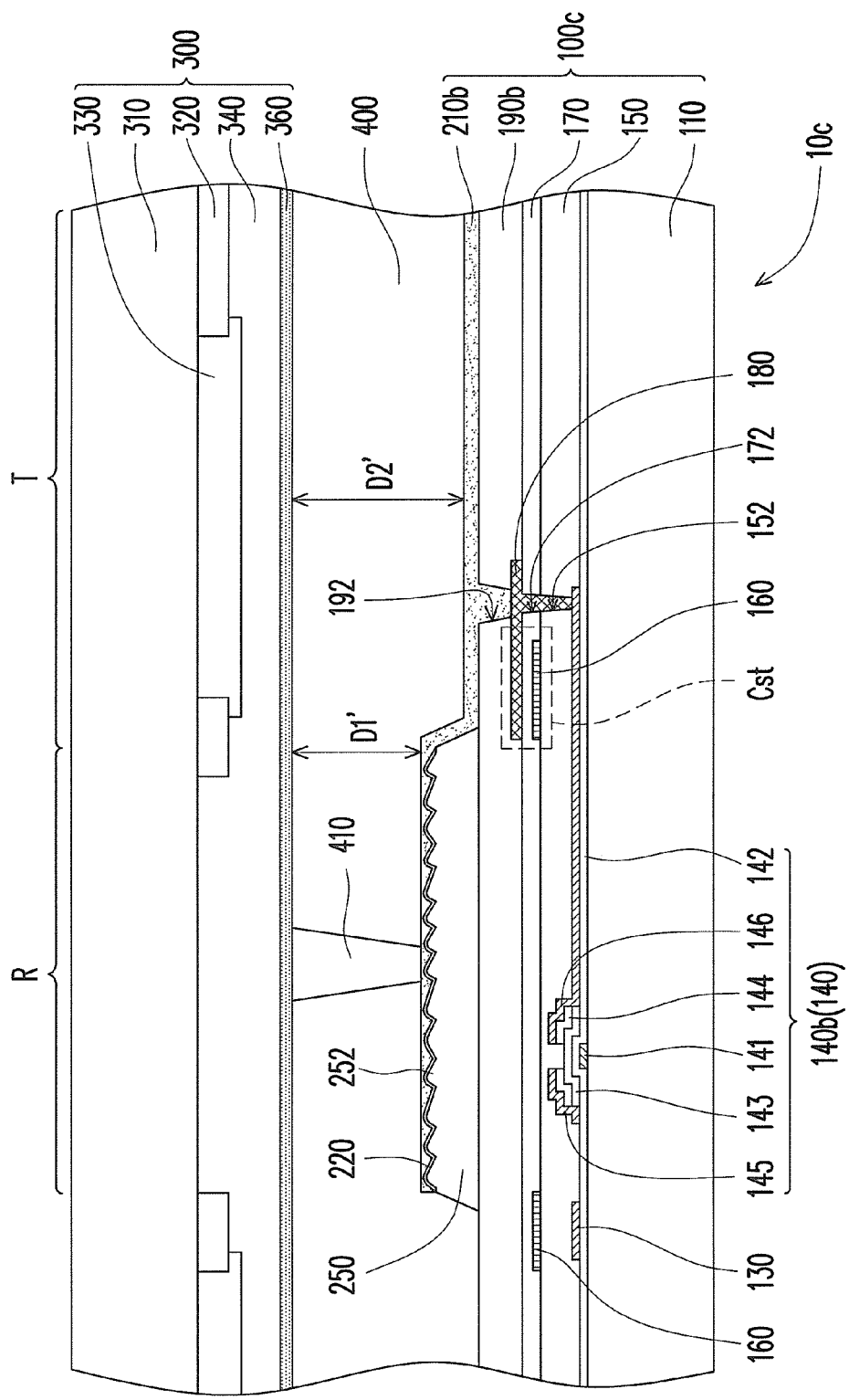
FIG. 4 is a sectional diagram of a display panel according to another embodiment of the present application.

The present application does not limit the position of the auxiliary layer 350. FIG. 4 is a sectional diagram of a display panel according to another embodiment of the present application. Referring to FIG. 4, in the display panel 10c of the present embodiment, the auxiliary layer 250 is disposed on the third dielectric layer 190b, wherein the auxiliary layer 250 has a plurality of bumps 252 located on the surface of the auxiliary layer 250, the reflective layers 220 is disposed on the surface 196 of the auxiliary layer 250 so as to cover the bumps 252 and the pixel electrodes 210b may substantially cover the reflective layers 220. In the embodiment, the cell gap between the opposite substrate 300 and the active device array substrate 100c at the position where the auxiliary layer 250 is disposed is D1', while the cell gap between the opposite substrate 300 and the active device array substrate 100c at the position without disposing the auxiliary layer 250 is D2', and the cell gap D1' is, for example, the half of the cell gap D2'. In addition, the auxiliary layer 250 is disposed on the active device array substrate 100c having the active devices 140, and various cell gaps between the opposite substrate 300 and the active device array substrate 100c are formed.

The common electrode layer 360 covers the auxiliary layer 350 and the surface of the passivation layer 340 where no auxiliary layer 250 is disposed, wherein the material of the common electrode layer 360 is, for example, transparent conductive material, for example, ITO or IZO. Since the common electrode layer 360 made of transparent conductive material is disposed on the transmissive region T, so that the structure is beneficial for the light from a backlight source of a backlight module (not shown) under the display panel 10 to be penetrated. On the other hand, since the reflective layers 220 is disposed on the reflective region R, so that the design is beneficial to reflect the light of an external light source irradiating on the display panel 10. In other words, the display panel 10 of the embodiment is a transflective LCD panel (TR-LCD panel). In addition, the display panel 10 in the embodiment further includes a plurality of spacers 410 (in FIG. 1, only one of them is shown). The spacers 410 are used for keeping the cell gap between the opposite substrate 300 and the active device array substrate 100a (cell gap D2).

It should be noted that the embodiment adopts HSD pixel architecture and the design of the scan-signal transmission line 230 (TGP design), so that the embodiment can effectively reduce the quantity of the employed data lines 130 and the quantity of the fan-out traces located at the ends of the scan lines 120. As a result, the display panel 10 of the embodiment can easily realize a slim-border design even a borderless design.

In summary, the active device array substrate of the present application is designed in this way that the reflective layers can be avoided from being peeled off due to oxidation, which is helpful to advance the yield rate of the production. On the other hand, since the present disclosure adopts HSD architecture of the pixels and the TGP design, the display panel of the present application can easily realize a slim-border design even a borderless design.

It will be apparent to those skilled in the art that the descriptions above are several preferred embodiments of the present application only, which does not limit the implementing range of the present application. Various modifications and variations can be made to the structure of the present application without departing from the scope or spirit of the invention.

What is claimed is:

1. An active device array substrate, comprising:
   a substrate;
   a plurality of scan lines disposed on the substrate;
   a plurality of data lines disposed on the substrate;
   a plurality of active devices disposed on the substrate, wherein at least a part of the active devices are electrically connected to the scan lines and the data lines;
   a first dielectric layer covering the scan lines, the data lines and the active devices;
   a common line disposed on the first dielectric layer;
   a second dielectric layer covering the common line and the first dielectric layer;
   a patterned conductive layer disposed on the second dielectric layer;
   a third dielectric layer covering the patterned conductive layer and the second dielectric layer; and
   a plurality of pixel electrodes disposed on the third dielectric layer, wherein the pixel electrodes are electrically connected to the patterned conductive layer and the active devices, and wherein the patterned conductive layer and the common line form a storage capacitor.

2. The active device array substrate as claimed in claim 1, wherein each of the active devices comprises a thin film transistor.

3. The active device array substrate as claimed in claim 1, wherein the first dielectric layer further has a plurality of first contact holes, the second dielectric layer further has a plurality of second contact holes located over the first contact holes, and wherein the patterned conductive layer is electrically connected to the active devices through the first contact holes and the second contact holes.

4. The active device array substrate as claimed in claim 3, wherein the third dielectric layer further has a plurality of third contact holes located over the second contact holes and the pixel electrodes are electrically connected to the patterned conductive layer through the third contact holes.

5. The active device array substrate as claimed in claim 1, further comprising a plurality of reflective layers, wherein the third dielectric layer has a plurality of bumps located on a top-surface of the third dielectric layer, the reflective layers are disposed on the top-surface of the third dielectric layer, and the pixel electrodes cover the reflective layers.

6. The active device array substrate as claimed in claim 1, wherein a material of the patterned conductive layer comprises transparent conductive material.

7. The active device array substrate as claimed in claim 1, wherein a material of the patterned conductive layer and the material of the pixel electrodes are the same.

8. The active device array substrate as claimed in claim 1, wherein the scan lines and the data lines are intersected with each other to define a plurality of display regions, the active devices and the pixel electrodes together form a plurality of display units disposed within the display regions, each of the display units is respectively electrically connected to two of the scan lines and one of the data lines, the pixel electrodes further comprise a first pixel electrode and a second pixel electrode, and the active devices further comprise a first active device and a second active device, wherein the first active device and the first pixel electrode electrically connected to the first active device together form a first sub-pixel, the first active device is electrically connected to the second active device, the second active device and the second pixel electrode together form a second sub-pixel, the first active device and the second active device are respectively electrically connected to the different scan lines, the second active device is electrically connected to the corresponding data line through the first active device, and among the display units of a same row, two adjacent display units of the plurality of display units are respectively electrically connected to the different data lines.

9. The active device array substrate as claimed in claim 1, further comprising a plurality of scan-signal transmission lines, wherein each of the scan-signal transmission line is respectively electrically connected to corresponding one of the scan lines.

10. The active device array substrate as claimed in claim 9, wherein the quantity of the scan-signal transmission lines is less than or equal to the quantity of the scan lines.

11. The active device array substrate as claimed in claim 9, wherein each of the scan-signal transmission lines is respectively located between two of the data lines adjacent to each other.

12. The active device array substrate as claimed in claim 9, wherein an extending direction of the scan-signal transmission lines and an extending direction of the data lines are substantially parallel to each other.

13. The active device array substrate as claimed in claim 9, wherein each of the scan-signal transmission lines further comprises:
   a first conductive pattern; and
   a second conductive pattern electrically connected to the first conductive pattern, wherein the second conductive patterns and the scan lines are intersected with each other.

* * * * *